(12) United States Patent
Booker

(10) Patent No.: US 7,176,694 B2
(45) Date of Patent: Feb. 13, 2007

(54) TESTING DEVICE AND METHOD OF TESTING INSULATED HANDLES USED FOR SERVICING HIGH VOLTAGE TRANSMISSION LINES

(76) Inventor: James R. Booker, 11718 Walnut Hill Dr., Baltimore, OH (US) 43105

( * ) Notice: Subject to any disclaimer, the term of this patent is extended or adjusted under 35 U.S.C. 154(b) by 0 days.

(21) Appl. No.: 11/360,727

(22) Filed: Feb. 23, 2006

(65) Prior Publication Data

US 2006/0208720 A1     Sep. 21, 2006

Related U.S. Application Data

(60) Provisional application No. 60/655,268, filed on Feb. 23, 2005.

(51) Int. Cl.
*G01N 27/00* (2006.01)
*H01H 31/12* (2006.01)

(52) U.S. Cl. ..................... 324/557; 324/551
(58) Field of Classification Search ............... 324/551, 324/557

See application file for complete search history.

(56) References Cited

U.S. PATENT DOCUMENTS 3,054,049 A * 9/1962 Chance ...................... 324/551

3,296,494 A * 1/1967 Stenger, Jr. et al. ........ 324/538
5,684,405 A * 11/1997 Rhein ........................ 324/557

FOREIGN PATENT DOCUMENTS

FR      2270594 A  *  1/1976

* cited by examiner

*Primary Examiner*—Andrew H. Hirshfeld
*Assistant Examiner*—Timothy J. Dole
(74) *Attorney, Agent, or Firm*—Francis Kremblas, Jr.; Kremblas, Foster, Phillips & Pollick

(57) ABSTRACT

A hot stick testing apparatus and method including a pair of generally ring-shaped electrodes spaced from one another at a predetermined distance. Each electrode has a central opening configured to receive the diameter of a hot stick under test positioned longitudinally through the central opening of both electrodes. Each electrode includes relatively smooth, outer surfaces presenting generally curved contours to enhance generating a relatively high electrical field intensity between the electrodes, without causing electrical flashover or arcing in the air gap between the electrodes. One of the electrodes is operatively connected to a source of high voltage and the other to ground. The testing apparatus has the ability to generate an electrical field intensity between the electrodes of about 140 to 170 kv per centimeter with an applied voltage in the range of 60 to 80 kv to the energized electrode.

4 Claims, 4 Drawing Sheets

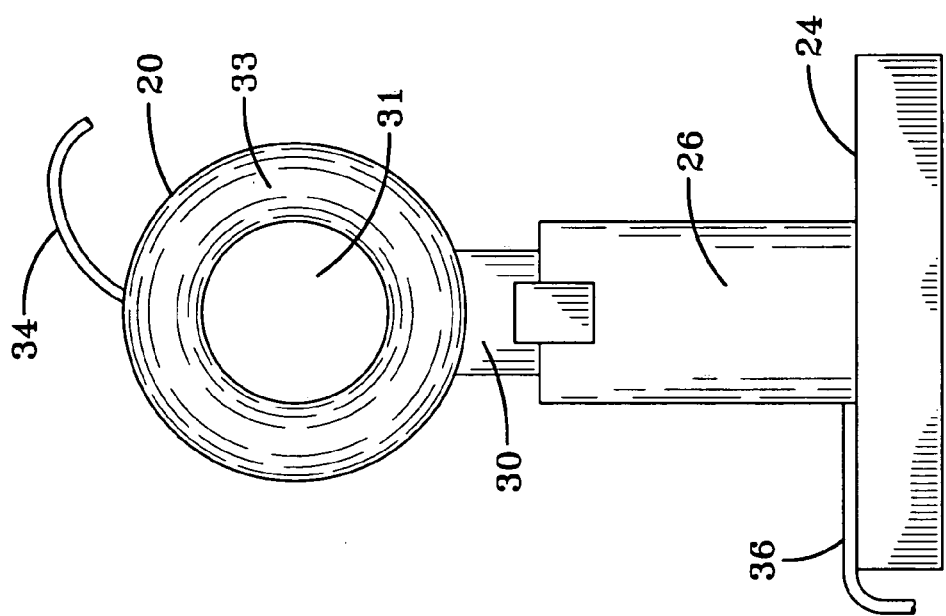
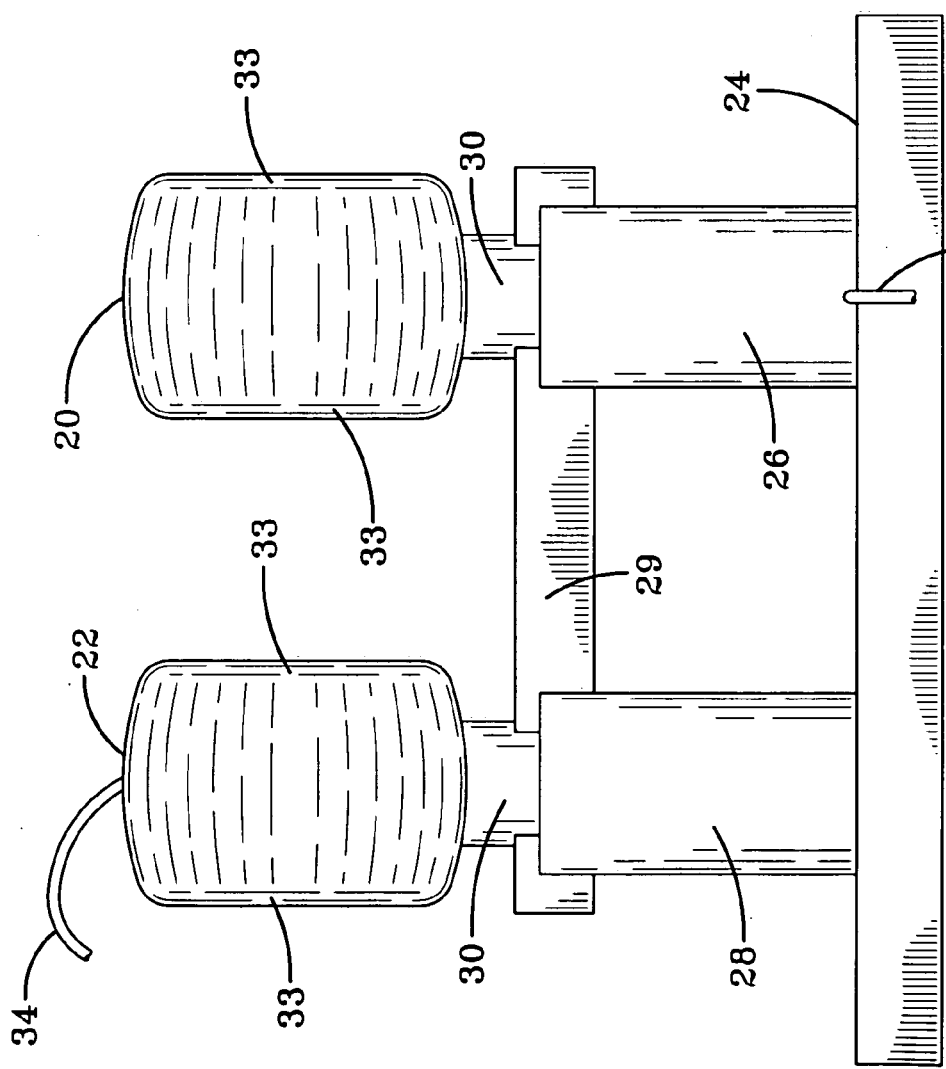

TESTING DEVICE AND METHOD OF TESTING INSULATED HANDLES USED FOR SERVICING HIGH VOLTAGE TRANSMISSION LINES

CROSS-REFERENCES TO RELATED APPLICATIONS

This application claims the benefit of U.S. Provisional Application No. 60/655,268 filed Feb. 23, 2005.

STATEMENT REGARDING FEDERALLY-SPONSORED RESEARCH AND DEVELOPMENT

REFERENCE TO AN APPENDIX

BACKGROUND OF THE INVENTION

1. Field of the Invention

This invention relates generally to safety measures directed to protecting workmen performing service and maintenance in connection with high voltage power transmission and distribution lines and particularly to an apparatus and method for testing the insulating quality of elongated, insulated rods connected to tools used during such service and maintenance procedures.

2. Description of the Related Art

For many decades power company workmen have performed various service and maintenance procedures in connection with energized power transmission and distribution lines referred to as live-line work in the industry. OSHA has published various rules concerning such work to attempt to insure the safety of such workers.

In addition to certain protective clothing often worn by the worker, certain specific procedures require tooling made with conductive material to be employed in contact with or close proximity to the live power line or associated parts thereof. For example, this includes clamps, cutters, cotter pin pullers and the like. Such tooling is connected to the end of an insulated elongate handle which is held at the opposing end by the worker for manipulation of the tool. Such handles are made of an insulating material and typically consist of long, generally cylindrical rods. The minimum length of the insulated handle is directed by OSHA standards and is related a voltage value determined by the voltage of the power line upon which the work is be done. Such rod-like, insulated handles may range from a few feet for 15 kv applications and up to 20 feet for very high voltage applications such as 500 to 765 kv lines. These insulated handles are referred to as "hot sticks" in the industry. Therefore the term "hot stick" as used herein is meant to refer to such insulated handles as described above.

As is well-known in this field, work in high voltage power transmission and distribution lines is very dangerous and requires appropriate safety measures and caution. Any failure in properly exercised safety may cause mistakes or accidents which often cause severe injury or death.

It is also well-known that without the appropriate protective measures, a high voltage gradient can cause electrical arcing which may travel significant distances if a conductive path between the voltage source and a lower voltage, such as ground, is established. Voltage gradient, sometimes referred to as electrical field intensity, is measured in voltage per unit of length. The very nature of live line work performed by those using hot stick tooling therefore requires appropriate testing procedures for the hot sticks prior to initial use as well as periodically after use to assure the rated safety value is valid to avoid the serious consequences of "flashover" or arcing traveling down the hot stick to the user holding the opposing end.

Currently the testing devices and method used for hot stick compliance testing have been found to be less than satisfactorily effective to detect certain defects which have the potential to cause a flashover or electric arc to be generated during use and result in serious injuries or death. While the number of such "flashover" incidents is relatively low, the catastrophic outcome requires a practical solution be found which to date has eluded those skilled in the art.

BRIEF SUMMARY OF THE INVENTION

The present invention relates to a hot stick testing apparatus to detect defects in a hot stick which may materially reduce its insulating function and represent an undesirable risk to the safety of the user.

In accordance with the present invention, a testing apparatus for detecting flaws in such hot sticks is provided which greatly increases the sensitivity of the test conditions to allow detection of priorly undetected flaws in the insulating function of hot sticks and provide a much greater assurance of avoidance of injury to the user in a practical manner.

The testing device of the present invention incorporates an electrode configuration which permits a significantly higher electric field intensity to be generated under test using a relatively inexpensive and readily available high voltage transformer and widely available 120 volt power source.

Additionally, a pair of relatively closely spaced electrodes mounted on a base and having an annular or ring configuration are aligned to receive the rod-shaped hot stick through a central, generally cylindrical opening in the electrodes to provide a compact, easily manufactured test unit for use in plant or readily transportable for in field use.

As another aspect of the present invention, the electrode configuration may be more closely spaced, as compared to prior art test arrangements of hot sticks, such that using no greater than a 100 kv transformer and 120 volt power source generates an electrical field intensity up to five or six times the electrical intensity generated by the 500 to 765 kv power transmission lines.

As another aspect, a pair of annular or ring shaped electrodes in accordance with a preferred embodiment of the present invention may possess an outer diameter of 4 to 6 inches and a central opening closely approaching the outer diameter of the form of hot sticks to be tested. Currently most hot sticks used have nominally 1 to 3 inch outer diameters.

As another aspect of the present invention, all outer surfaces of the electrodes in a preferred embodiment are provided with rounded and smooth surfaces to further increase the voltage gradient required to produce an "air gap" flashover between the electrodes. "Air gap" flashover as used herein is meant to refer to electrical arcing between the energized electrode connected to the voltage source and the opposing spaced electrode connected to ground with ambient air as the only conductor between the electrodes.

As a further aspect of the present invention, the configuration and spacing of the electrodes permits the use of standard, commercially available transformers of about 100 kv and a standard 120 volt power source to be employed such that the testing unit and associated equipment is of a compact size readily transportable for in field use, yet generate very high electrical field intensity levels to provide greater sensitivity for detecting insulating flaws in hot sticks which flaws are capable of contributing to life-threatening flashover incidents during use.

As a further aspect of the present invention, the annular or ring shaped electrodes provide a continuous full circle central opening having dimensions to accept the hot sticks in a manner in which the entire outer surface of the hot stick disposed within the opening is subjected to the electrical field intensity generated in a substantially equal manner. Therefore the hot stick may be longitudinally passed through the central openings of the electrodes without rotation, and the entire outer surface of the hot stick is subjected to substantially the same test conditions for detecting flaws in the insulating capacity.

BRIEF DESCRIPTION OF THE SEVERAL VIEWS OF THE DRAWINGS

FIG. 2 is a side elevational view of the apparatus shown in FIG. 1; and

FIG. 3 is a right end view of the apparatus shown in the preceding FIGS.

Figure 1:
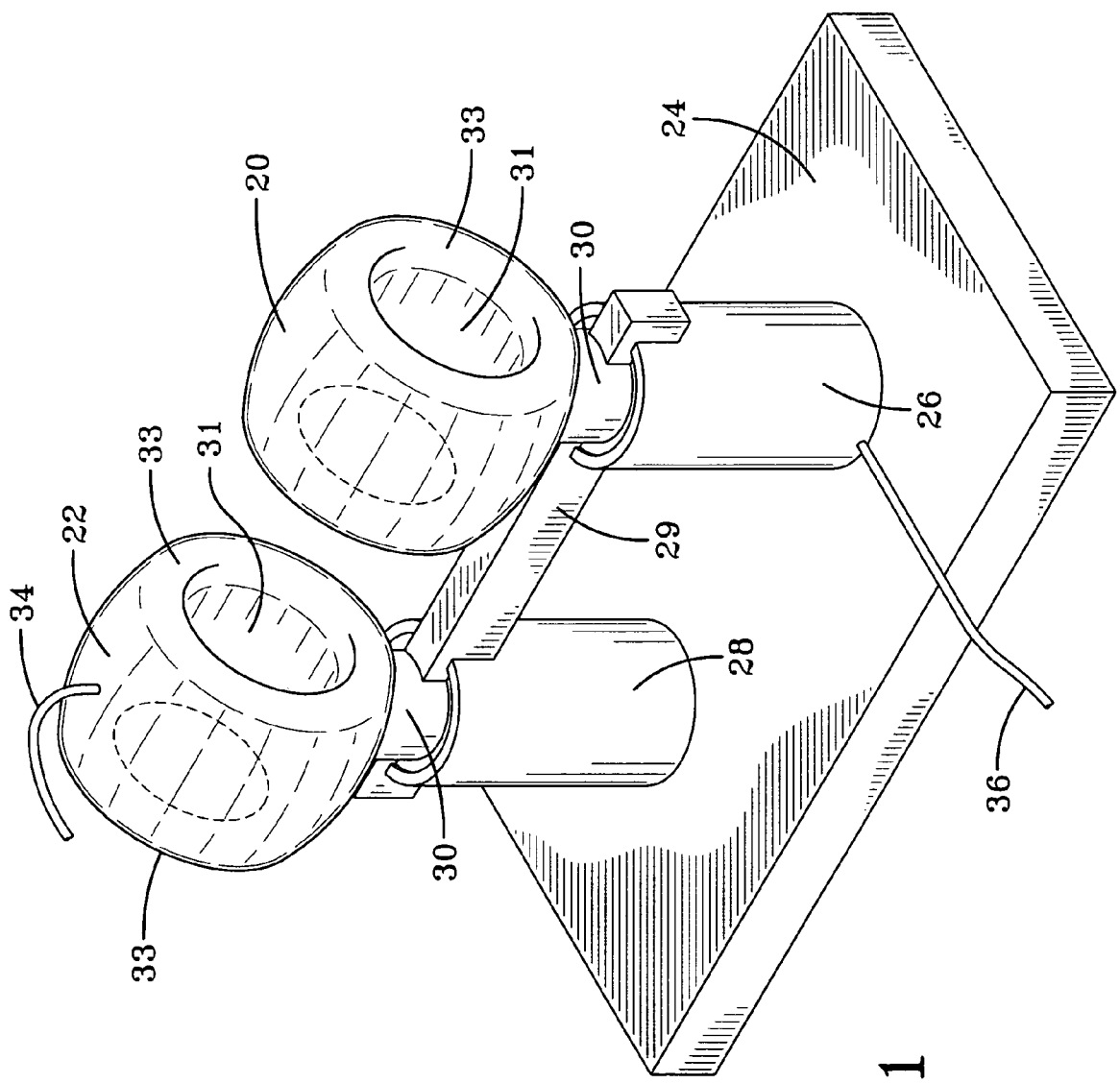
FIG. 1 is a perspective view of an apparatus for testing hot sticks for defects in their insulation capacity or rating constructed in accordance with the present invention.

In describing the preferred embodiment of the invention which is illustrated in the drawings, specific terminology will be resorted to for the sake of clarity. However, it is not intended that the invention be limited to the specific term so selected, and it is to be understood that each specific term includes all technical equivalents which operate in a similar manner to accomplish a similar purpose. For example, the word connected or term similar thereto are often used. They are not limited to direct connection, but include connection through other elements where such connection is recognized as being equivalent by those skilled in the art.

DETAILED DESCRIPTION OF THE INVENTION

An apparatus to detect defects in elongated insulation handles or hot sticks used for carrying tools useful for working on live high voltage power transmission and distribution lines constructed in accordance with the present invention is shown in FIGS. 1–3.

The test apparatus comprising a pair of electrodes 20, 22 provided with a generally ring or donut-like configuration spaced a predetermined distance from one another on an insulated base 24.

In the preferred embodiment shown in FIGS. 1–3, electrodes 20 and 22 comprise aluminum and are mounted in a fixed position on a pair of spaced hollow towers 26 and 28 via a short length of hollow cylindrical tube 30 concentrically mounted into a respective top opening of towers 26 and 28. A bridging support member 29, comprising a non-conductive or insulating material, may be included which is fixed connected to each tube 30.

Tower mounts 26 and 28 are mounted on the upper surface of base 24 in a stable position.

Base 24, towers 26 and 28 and mounting tubes 30 comprise a non-conductive insulating material, such as, for example, plastic or wood.

In the preferred embodiment, each electrode 20, 22 has a ring-shaped or donut configuration with a central opening 31 configured to receive the outer diameter of a hot stick. In most instances, hot sticks comprise elongate rod shaped poles having a circular, cylindrical configuration and, therefore, a similar shape is preferred for central opening 31. Since hot sticks currently are commercially made in nominally 1 to 3 inch diameters, central opening 31 preferably is provided with a diameter approximately ¼ to ½ inch greater than the diameter of the hot sticks to be tested. Further, the edges 33 surrounding the central openings are rounded to present a smooth contour.

Figure 4:
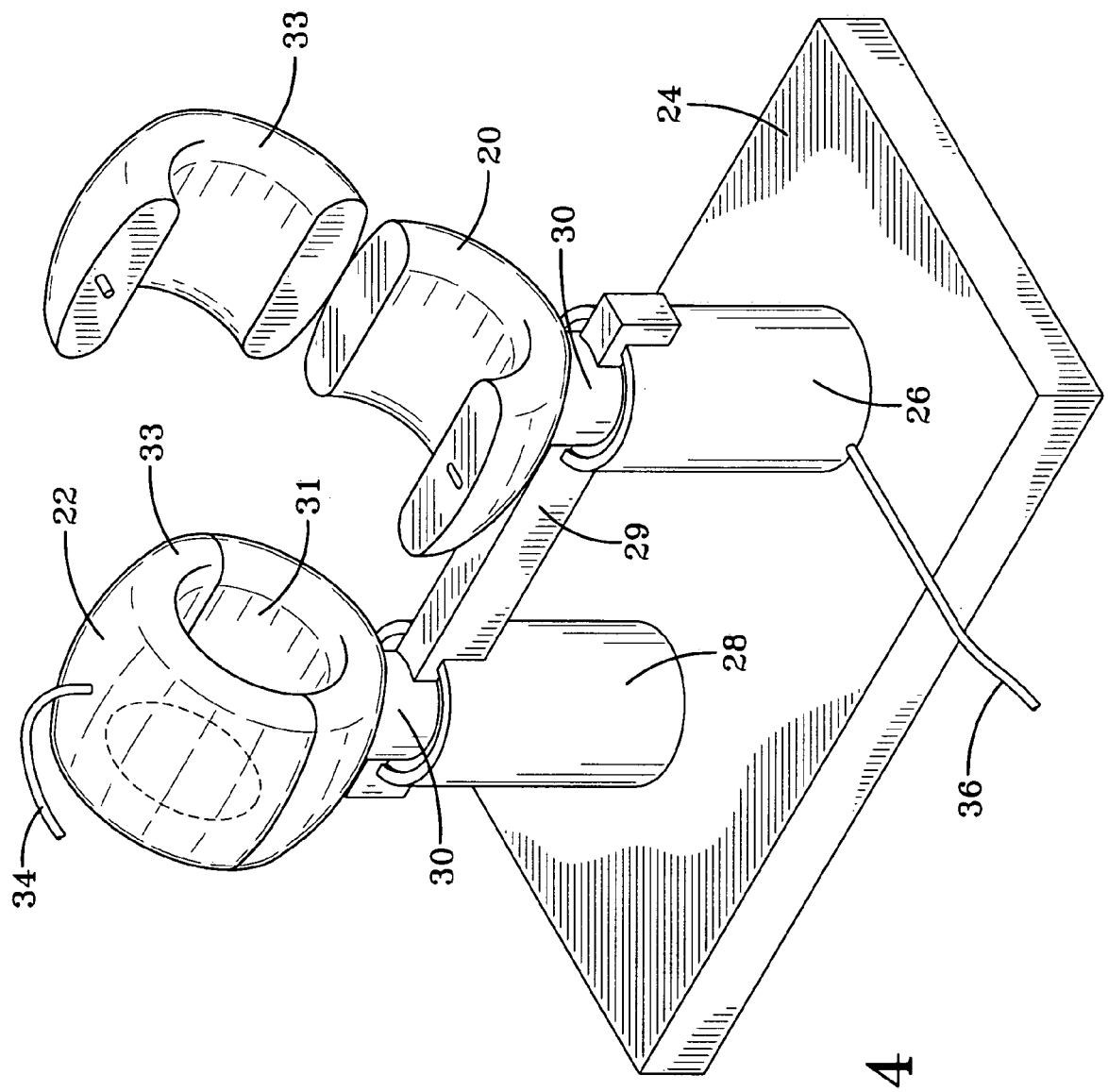
FIG. 4 is a perspective view of the apparatus shown in the preceding FIGS.
Figure 5:
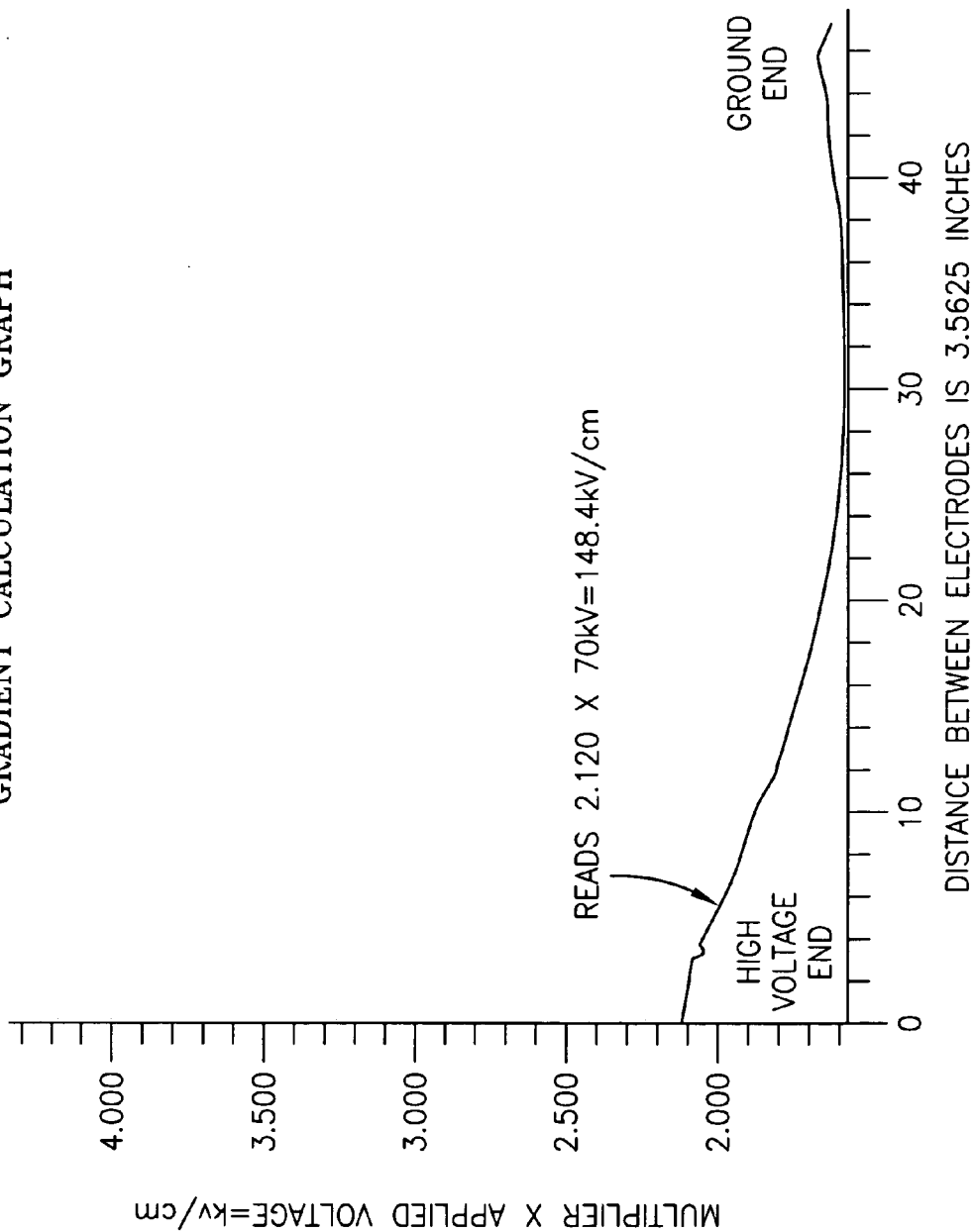
FIG. 5 is a voltage gradient calculation graph prepared by experts in this field from Magsoft Corporation.

To make insertion of a hot stick more convenient, the ring-shaped electrodes 20 and 22 may be in the form of split halves, such as illustrated in FIG. 4, which may be hingedly connected to allow the upper half portion to be swung open to allow the hot stick to be loaded from the top. Prior to testing, the upper half portion would be replaced to return the conductor to its original closed ring shape. Alternatively, each conductor may be simply split into half portions and removably fitted together using a conventional peg and hole arrangement or some other well-known equivalent to releasably fix each half of the ring-shaped conductor to one another in the closed ring configuration shown in FIG. 1.

It should be noted that one may use a larger diameter opening for central opening 31 compared to the diameter of the hot stick under test than noted above and provide insulated support holders on opposing sides of the test device. The support holders, not shown, would be aligned to support a hot stick extended through the central opening of each electrode in a manner in which the outer diameter of the hot stick is supported concentrically within each central opening 31 with its outer surfaces spaced approximately an equal nominal distance from the inner surfaces of each electrode which define central opening 31. While this more precise centering of the hot stick under test within each central opening 31 is not critical, it is recommended to assure that the outer surfaces of the hot stick under test are exposed to the electrical field intensity created during testing relatively equally.

Further, unless the inner surfaces of each electrode 20, 22 which define central opening 31 are coated with a material, such as Teflon for example, the more precise centering of the hot stick within the electrodes avoids contact with the aluminum electrodes. Upon relative movement of the hot stick longitudinally along its length through the openings 31, sliding contact with the aluminum surfaces of electrodes 20 and 22 may impart minute traces of aluminum to the hot stick surface. An accumulation of such minor deposits of conductive material are likely to cause a flashover during testing and have been shown to be highly suspect in causing flashovers in the field in actual use.

With reference to FIG. 1, a separate conductive wire is operative connected to each electrode 20, 22. One of such wires 36 may be connected to ground. The other wire 34 may be connected to a high voltage source, preferably a conventional transformer, not shown.

The transformer may be connected to a conventional source of 120 volt electrical output, which may be a conventional generator for testing in the field.

Preferably, the transformer is adjustable to deliver up to 100 kilovolts which is more than sufficient to create an electrical stress or voltage gradient up to 6 or 7 times the electrical stress created in connection with the higher voltage transmission and distribution lines as described in detail later herein.

The distance between the opposing surfaces of electrodes 20 and 22 is an important factor in accordance with the present invention because it relates to the voltage gradient or electrical field intensity generated to which the length of the hot stick under test between electrodes 20, 22 is subjected.

In accordance with the present invention, the space between electrodes 20 and 22 preferably may vary between about 3 to 6 inches depending upon the chosen level of voltage delivered by the transformer and the level of electrical field intensity or voltage gradient sufficient to expose the hot stick to an electrical field intensity sufficient to provide a good safety factor. Preferably, such a safety factor is about 2 to 6 times the voltage gradient one expects to be generated by the transmission line upon which the hot stick is rated for use. A safety factor of greater than about 4 is more preferred.

It is highly preferred that the ring-shaped electrodes 20, 22 have a relatively high degree of surface smoothness. In a preferred embodiment a surface finish of approximately 32 microinches has been found to work well in testing. This aspect further lends itself to the ability to create a high level of electrical field intensity between the electrodes 20 and 22 which is less than that required to cause an air gap flashover and still sufficient to create testing conditions exposing the hot stick to a more stringent test than current testing apparatus.

In accordance with the present invention, the object of providing a more reliable hot stick testing device in a relatively inexpensive and practical manner relies upon the ability to develop sufficiently high voltage gradient conditions which will provide a significantly higher safety factor than the current testing apparatus used presently such that passing hot sticks are more reliable in the field.

Such a testing device should enable the testing device to subject the hot stick to more stringent conditions representing a higher voltage gradient than that typically generated by the transmission and distribution lines upon which the hot sticks are rated safe for use by the workers. It should be noted that past and current testing apparatus have cleared hot sticks for use wherein the voltage gradient generated is less than that to which the hot stick will be exposed in actual field use.

The configuration of electrodes 20 and 22 are such that they may be spaced much closer together than in present hot stick testing apparatus configurations such that a higher voltage gradient may be generated between the electrodes before arcing through the air gap between the electrodes occurs as compared to prior hot stick testing devices.

Obviously, if the voltage gradient generated between the electrodes causes a flashover or electrical arcing without the hot stick disposed in a test condition (air gap flashover), no practical test result may be obtained. Therefore, the ring-shaped configuration of electrodes 20 and 22, provided with relatively smooth and rounded surfaces, has been found to allow high voltage gradients to be developed without arcing in air when electrodes 20 and 22 are much closer spaced to one another than the electrode spacing and configurations used in any previous portable hot stick testing apparatus made in accordance with the prior art.

Additionally, it has been found in accordance with the present invention that a space between electrodes 20, 22 of about 3–½ inches to 4 inches may be employed with an input voltage to the energized electrode between about 50 to 80 kilovolts covers most high voltage transmission line field conditions at a safety factor of between about 150 to 600 percent greater than the electrical field intensity generated by high voltage transmission lines presently in use.

This result is contrasted to currently used hot stick testing devices which essentially merely meet the accepted standard of 100 kilovolts per 12 inches applicable to field work on 345 to 765 kv power transmission lines. Reliable field reports have calculated the effective voltage gradients within a high elevation tower supporting a 765 kilovolt line to be as great as 28 kilovolts per centimeter. This greatly exceeds the 100 kilovolts over 12 inches between electrodes which is the testing standard currently used in present testing apparatus. Prior and present hot stick testing apparatus generate about 8 or 9 kilovolts per centimeter using 100 kv of applied voltage over 12 inches or its equivalent.

The present inventor is aware of tests on a prior art test apparatus on hot sticks rated safe for use on 500 to 765 kv lines in which a four inch wide aluminum strip was wrapped around a portion of a hot stick and centered between the electrodes spaced 12 inches apart. Then 100 kv was applied to the energized electrode. No flashover was observed. This experiment indicates the insufficient sensitivity of such prior art test apparatus and their use.

However, in the field, under most use conditions on such high voltage lines, such a strip of aluminum is highly likely to cause a flash over and arcing down the length of the hot stick to the closest ground. If the user is within a grounded tower, the tower may take the brunt of the electrical arc. However, even in such a case, the worker may be subjected to serious injury by the high amperage represented in such an electrical arc. If any part of the user happens to be exposed outside the tower, the resulting injury would likely be fatal.

To further demonstrate the need for an improved apparatus for testing hot sticks to maintain the rated safety value, a series of tests were conducted employing hot sticks in current use which had been periodically tested using a commercially available hot stick tester. These hot sticks were rated safe to use on up to 500 kv lines and all had previously passed tests using conventional testing apparatus rated 100 kv per 12 inches or its equivalent.

Using the apparatus of the present invention, only 17 hot sticks from over 90 tested produced no flashover during the initial testing procedure. The apparatus of the present invention used in this testing comprised the configuration shown herein wherein the annular ring-shaped electrodes 20, 22 were made of aluminum and had generally cylindrical shape having a nominal six inch diameter with the central opening 31 about nominally 3.25 inches in diameter. The opposing end surfaces 33 surrounding central opening 31 were beveled about a ½ inch radius and the exposed outer surfaces were provided with a 32 micro-finish which provides a relatively good smooth surface.

A conventional 100 kv transformer was connected to a conventional 120 volt outlet and to the wire 34 connected to electrode 22. Wire 36 connected to electrode 20 was connected to ground.

The air gap or space between the electrodes was about 3%16 inches and the transformer was set to deliver about 68 kv to electrode 22 after determining that an air gap flashover occurred at about 78 kv with no hot stick within the apparatus. It should be noted that flashover is affected by the relative air density present over a range of applied voltage.

Under these conditions, the maximum voltage gradient or electric field intensity developed may vary between approximately the range of 140 to 170 kv per centimeter. This compares to approximately 28 kv per centimeter maximum voltage gradient developed by a 765 kv transmission line. The strict test condition noted herein provides approximately a 500 to 600 percent safety factor which, of course, may be lowered to about 150 percent and still provide a much improved test compared to the current testing apparatus which operate under the 100 kv per 12 inch standard.

This latter standard is equivalent to approximately 9 kv per cm. This is about equal to the calculated maximum voltage gradient for a typical commercial 345 kv transmission line.

The graph illustrated in FIG. 4 represents a calculation of the voltage gradient generated by the testing device described in the preferred embodiment herein when the distance between the electrodes 20 and 22 was measured to be about 3.56 inches. This graph was generated by a company unrelated to applicant and having a reputation of expertise in connection with calculation of voltage gradients.

The graph depicts a multiplier on the "y" axis with the distance between the electrodes 20, 22 at the 3.56 inches gap. The graph shows a maximum gradient of 148.4 kv/cm at or very near the high voltage conductor and a gradual lowing of the gradient as the distance from the high voltage conductor increases. However, even relatively near the ground conductor 20, the voltage gradient appears to be in the range of about at least 100 kv/cm.

The importance of developing a much higher voltage gradient than the current hot stick testing apparatus is highlighted even greater by analysis of the hot sticks tested as noted above. Using a 100× microscope, many small particles of metal, including aluminum and zinc, were found on the hot sticks which failed using the test apparatus of the present invention.

While not seen by the naked eye, these conductive contaminates on the surface of the hot sticks likely were the result of frictional contact of the hot stick in use, with aluminum and galvanized surfaces and aged conductors. Such contact deposits micron size conductive particles onto the surface of the fiberglass reinforced plastic insulating composition comprising the hot stick. Tests conducted have shown that significant deposits of this type on currently used hot sticks are not detected using presently commercially available hot stick testing apparatus and methods. This is particularly emphasized by tests conducted using such testing apparatus wherein significant strips of aluminum wrapped around a length of the hot stick under test failed to cause a flashover. However, such a hot stick with these aluminum strips would not be used in the field because of the obvious conductive contamination visible to the user. This degree of insensitivity to conductive contamination of the hot stick in current testing apparatus clearly indicates a need to improve such testing conditions and constructively modify maintenance of hot sticks to raise the level of safety and prevent serious and dangerous failures in the field.

Upon examination of the failed hot sticks under a 100× microscope, twenty-five appeared to show areas wherein conductive contaminates were burned off the surface of the hot stick by the flashover arc which occurred during the test. No other contaminated areas were observed. Upon re-testing, these 25 hot sticks passed. This indicates that under the test conditions noted above, at least some conductive contaminants may be burned off and removed during testing by the flashover which occurred. The remaining hot sticks which failed were rigorously cleaned to attempt to remove any conductive particles contaminating the surface of the hot sticks. After such cleaning, all but six of these initial failures passed a second testing using the apparatus of the present invention wherein no flashover was observed. These passing hot sticks are clearly in a safe condition for field use. The six hot sticks which failed again indicate they should be replaced since the extensive cleaning and reconditioning did not return them to a passing condition.

In several instances, hot stick failure was related to labels or decals placed near the working end of the hot sticks. Examination showed that such labels were roughened or torn and likely represented areas where conductive contamination build up could readily occur. Such data leads one to recommend such labels never be applied near the working end of the hot stick and be placed, if deemed necessary, near the opposing non-working end. The damage to the labels most likely occurred by frictional contact with aluminum or galvanized surfaces in much the same manner as referred to above herein and tends to lead to a more rapid build-up of contaminating conductive particles.

In view of the above description, it should be readily understood that hot stick testing apparatus constructed in accordance with the present invention provides a simple, relatively inexpensive means to greatly improve hot stick testing to provide greater safety to users in the field. Further, it exposes the weaknesses and flaws of the currently used hot stick testing devices and the current industry standard for such testing. It is believed that the configuration of the electrodes used in these prior testing apparatus is a major limiting factor in their ability to generate truly adequate testing conditions.

It should also be noted that the apparatus of the present invention may be easily adjusted relative to electrode spacing and to applied voltages less than 100 kv to provide a safety factor in the more preferred range of 2 to 6 times the expected electrical field intensity encountered during its intended use. It is preferred to choose a higher safety standard deemed most appropriate to safeguard hot stick users in the field.

The invention claimed is:

1. A testing device to detect defects in insulated elongate rod-like handles for carrying tools on one end thereof for use in the servicing and maintenance of high voltage transmission lines, comprising, in combination;
    a) a first and second electrode, each comprising a substantially ring-shaped configuration, said electrodes being supported on a base in a predetermined laterally spaced relationship from one another and each including a central opening aligned with the central opening of the other electrode to receive the rod-like insulated handle under test;
    b) means to operatively connect the first electrode to a source of high voltage and means to connect the second electrode to ground; and
    c) the spaced relationship between said electrodes and the applied voltage to said first electrode being selected to achieve at least 1.5 times the electrical field intensity of the electrical transmission line upon which the rod-like insulated handle is rated safe to use without causing an electrical arc between said electrodes when ambient air is the only conductor between the electrodes.

2. The device defined in claim 1 wherein the outer surfaces of said electrodes are provided with a surface finish of at least approximately 32 microinches.

3. The device defined in claim 1 wherein the spaced relationship between said electrodes measured along the longitudinal axis of said central openings is between about three and one-quarter to four and one-half inches.

4. The device defined in claim 3 wherein the voltage applied to said first electrode is between about 50 to 80 kilovolts.

* * * * *